United States Patent [19]
Lee

[11] Patent Number: 5,724,228
[45] Date of Patent: Mar. 3, 1998

[54] CPU HEAT DISSIPATOR

[76] Inventor: Tzu-I Lee, 2F, No. 362, Ta Nan Road, Shin Lin, Taipei City, Taiwan

[21] Appl. No.: 696,515

[22] Filed: Aug. 14, 1996

[51] Int. Cl.[6] ........................................ H05K 7/20
[52] U.S. Cl. .................. 361/697; 165/80.3; 165/122; 165/185; 257/722
[58] Field of Search .................. 165/80.2, 80.3, 165/122, 185; 174/16.3; 257/714, 722, 718-719, 726-727; 361/695, 697, 704, 707, 710, 715, 717, 718, 722

[56] References Cited

U.S. PATENT DOCUMENTS

| | | |
|---|---|---|
| 5,421,402 | 6/1995 | Lin ........................... 361/697 |
| 5,504,650 | 4/1996 | Katsui et al. ............... 361/697 |
| 5,522,700 | 6/1996 | Hong ......................... 165/122 |
| 5,526,875 | 6/1996 | Lin ........................... 361/697 |
| 5,584,339 | 12/1996 | Hong ......................... 165/80.3 |

*Primary Examiner*—Gregory D. Thompson
*Attorney, Agent, or Firm*—Notaro & Michalos P.C.

[57] ABSTRACT

A heat dissipator includes a dissipator body having a flat base adapted to be placed on a CPU and a plurality of fins formed thereon. Air passages are defined between the fins. A holding frame made of a resilient material, such as plastics, is provided, comprising two resiliently deformable securing arms mounted to two opposite sides thereof. Each of the securing arms has a central bore to receive and fix therein a retaining plate which has a lower openings located outside the securing arm to engage a sideways lug formed on a CPU connector on which the CPU is mounted so as to secure the CPU on the connector. A convection fan is integrally incorporated in the holding frame. The retaining plates may be provided with apertures which allow the plastics to fill therein in injection molding the holding frame so as to securely fix the retaining plates within the bores of the securing arms. Leaf springs are provided between the dissipator body and the holding frame to provide a more secure engagement between the retaining plates and the sideways lugs of the connector. Catches are provided on the underside of the holding frame and counterpart members are provided on the dissipator for engagement with the catches and securing the holding frame to the dissipator body.

9 Claims, 6 Drawing Sheets

CPU HEAT DISSIPATOR

FIELD OF THE INVENTION

The present invention relates generally to a heat dissipator for a computer central processing unit (CPU) and in particular to a force convection type heat dissipator for use in a ZIF type CPU connector.

BACKGROUND OF THE INVENTION

Computer CPU is now running much faster than ever and the heat generated in the CPU is also much more serve. To ensure proper functioning of the CPU, external heat dissipators have been developed. Some of the CPU heat dissipators make use of free convection to dissipate heat into the surroundings. In such a free convection heat dissipator, the dissipator comprises a base made of a great heat conductivity material to be placed on a top surface of a CPU and a plurality of fins extend from the base for performing free convection. Securing means is provided to secure the heat dissipator to the CPU.

To increase the heat removal rate, force convection type heat dissipator has also been developed. The force convection heat dissipator comprises a fan mounted on the top of the fins so as to force air to flow through the spacing between fins, achieving force convection. An example of the force convection type heat dissipator for ZIF type CPU connector is disclosed in Taiwan patent publication No. 245982 (application No. 83217100) of which an exploded perspective view is shown in FIG. 6 of the attached drawings, with the convection fan removed. The Taiwan 245982 patent discloses a heat dissipator 4 having a base on which a plurality of fins are formed. The base has a substantially flat bottom face to be placed on the top side of a CPU 3 which is in turn mounted to a ZIF connector 2 to be fixed to a printed circuit board (not shown). The connector 2 has two sideways lugs 21 respectively formed on two opposite sides thereof.

A securing member 7, in the form of an elongated strip to be received within a central channel formed on the heat dissipator 4, comprises two holding arms 11 respectively mounted to two lengthwise ends thereof to be rotatable relative thereto. Each of the arms 11 has an opening 12 formed thereon and is provided with a finger control tab 13 to allow a user to rotate the arm 11 relative to the elongated strip for receiving the corresponding sideways lug 21 of the connector 2 within the opening 12 and thus securing the heat dissipator 4 on the CPU 3.

The elongated strip of the securing member 1 comprises two inclined end sections, serving as leaf springs, to provide the arms 11 with elastic deformability toward the sideways lugs 21 of the connector 2 so as to ensure secure engagement between the sideways lugs 21 and the openings 12 of the arms 11.

The convection fan, which is not shown in FIG. 6, is then mounted to the top of the fins with screws (not shown) which have an outside diameter larger than the spacing between two adjacent fins and "self-tap" into the spacing for securing the fan on the top of the dissipator 4.

A disadvantage associated with the prior art structure is that in a computer, there is always very limited space left for user's finger to operate the control tab 13 of the holding arms 11 and thus makes mounting the conventional heat dissipator to the CPU very difficult.

Further, using "self-tapping" screws to secure the fan on the top of the fins may damage the fins and thus deteriorate the heat removal rate thereof. Besides, if the fins are damaged to such an extent that they are no longer able to hold the screws, then the dissipator has to be discarded and replaced with a new one. This increases the overall cost.

Thus, it is desirable to have an improved force convection type heat dissipator for use in a ZIF connector which eliminates the above discussed problems of the prior art force convection CPU heat dissipator.

SUMMARY OF THE INVENTION

It is therefore an object of the present invention to provide a CPU heat dissipator which is easy to be mounted to a CPU so as to eliminate the need for finger operation that is required in the conventional structure.

It is another object of the present invention to provide a CPU heat dissipator wherein the convection fan is integrally mounted on a holding frame which is then used to retain the heat dissipator on the CPU so that no external fastener, such as screw, is needed and the fins of the heat dissipator are not to be damaged by the screw.

It is a further object of the present invention to provide a CPU heat dissipator comprising a holding frame which is made of a resilient material, such as plastics, so as to allow easy manual mounting of the heat dissipator to the CPU.

It is yet another object of the present invention to provide a CPU heat dissipator of which the holding frame is made of plastics by injection molding so as to securely fix members of other materials, such as metal, therein.

To achieve the above objects, there is provided a heat dissipator comprising a dissipator body having a flat base adapted to be placed on a CPU and a plurality of fins formed thereon. Air passages are defined between the fins. A holding frame made of a resilient material, such as plastics, is provided, comprising two resiliently deformable securing arms mounted to two opposite sides thereof. Each of the securing arms has a central bore to receive and fix therein a retaining plate which has a lower openings located outside the securing arm to engage a sideways lug formed on a CPU connector on which the CPU is mounted so as to secure the CPU on the connector. A convection fan is integrally incorporated in the holding frame. The retaining plates may be provided with apertures which allow the plastics to fill therein in injection molding the holding frame so as to securely fix the retaining plates within the bores of the securing arms. Leaf springs are provided between the dissipator body and the holding frame to provide a more secure engagement between the retaining plates and the sideways lugs of the connector. Catches are provided on the underside of the holding frame and counterpart members are provided on the dissipator for engagement with the catches and securing the holding frame to the dissipator body.

These and other objects and advantages of the present invention will become more apparent from a consideration of the following detailed description of preferred embodiments thereof, when read in conjunction with the accompanying drawings, wherein:

DETAILED DESCRIPTION OF THE PREFERRED EMBODIMENTS

Figure 1:
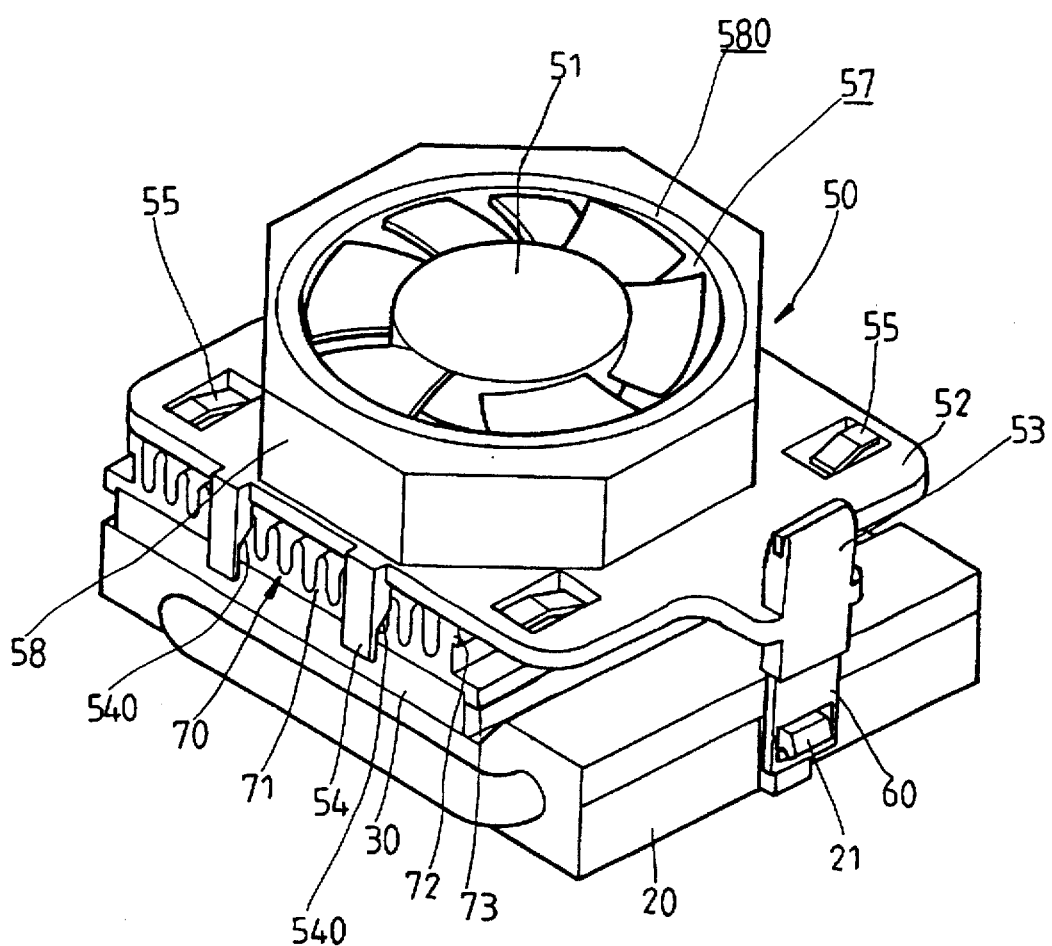
FIG. 1 is a perspective view showing a heat dissipator constructed in accordance with the present invention mounted on a CPU connector with a CPU sandwiched therebetween.
Figure 2:
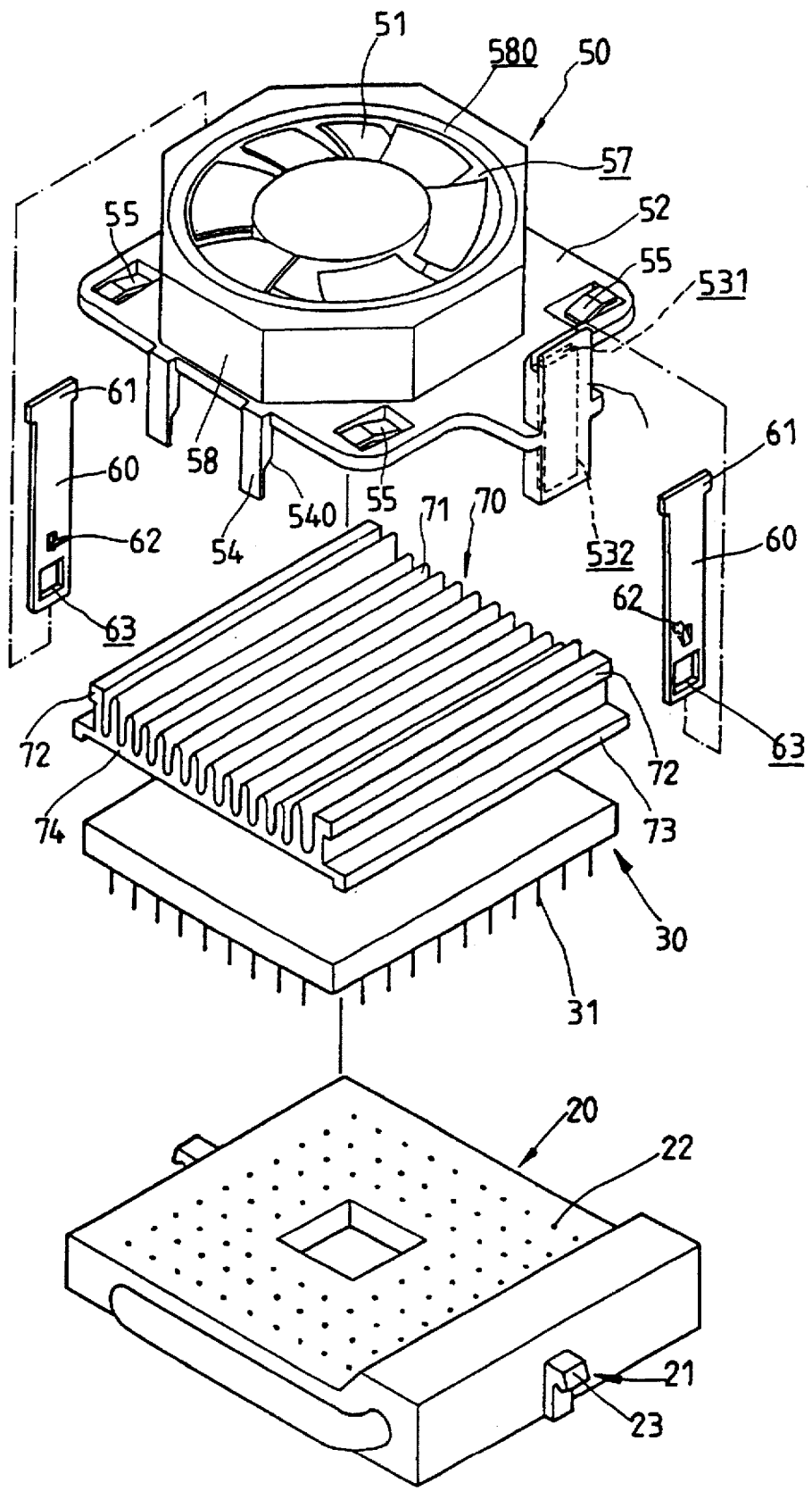
FIG. 2 is an exploded perspective view showing the heat dissipator of the present invention together with the CPU and CPU connector.
Figure 6:
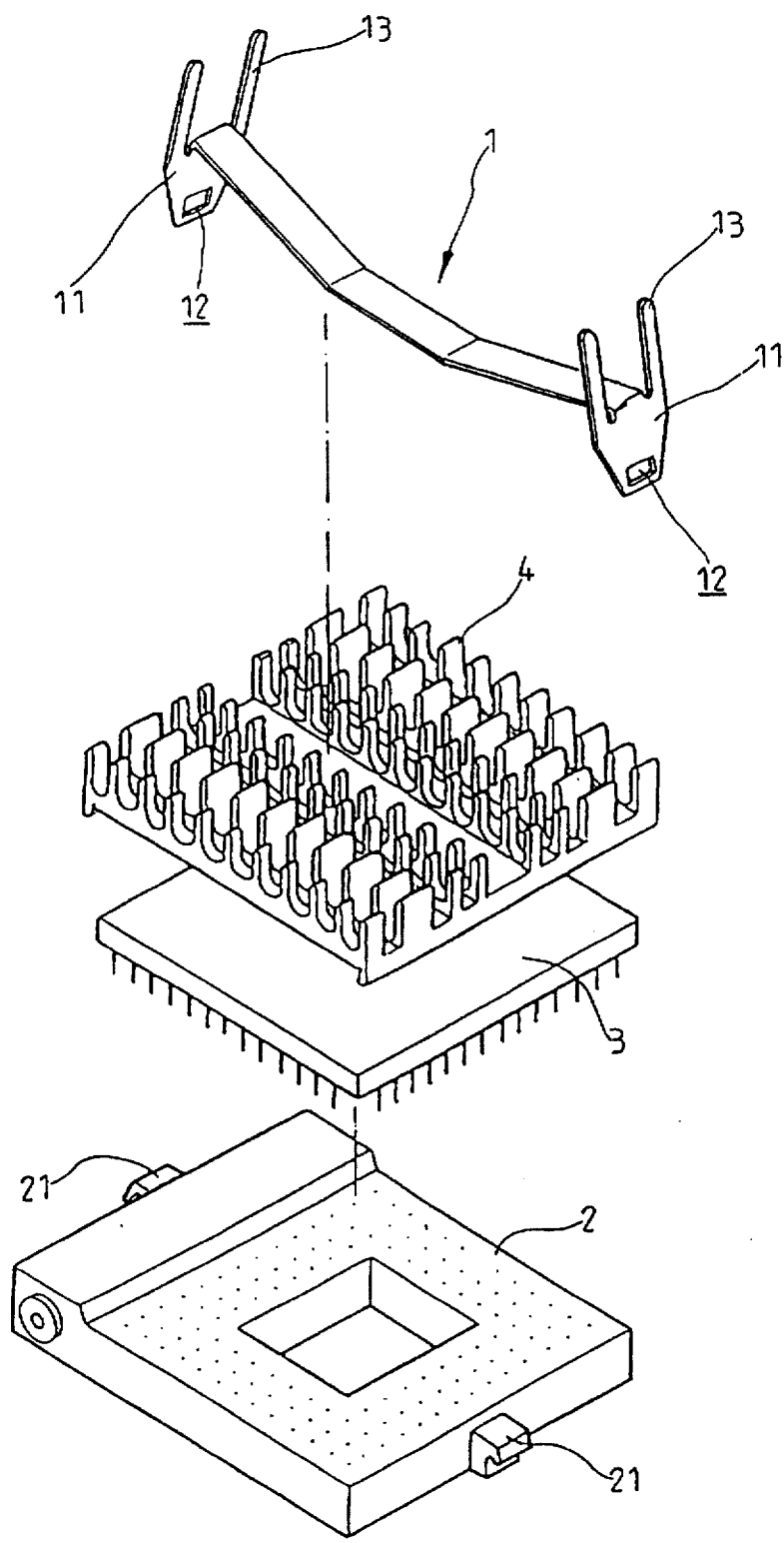
FIG. 6 shows an exploded perspective view of a prior art CPU heat dissipator.

Referring to the drawings and in particular to FIGS. 1 and 2, wherein a force convection type heat dissipator for use in a ZIF type CPU connector is shown, the heat dissipator of the present invention comprises a dissipator body 70 having a base 74 with a substantially flat bottom face to be placed on a top side of a computer central processing unit (CPU) 30 and a plurality of fins 71 formed on a top face thereof and spaced from each other to define therebetween air passages. In the embodiment illustrated, the fins 71 are parallel with each other and extending in a first direction. Each of the fins 71 may also be cut into a number of intermittent segments spaced from each other in the first direction, but in alignment with the segments of the other fins 71 in a second direction that is substantially normal to the first direction, as that shown in FIG. 6.

Further, in the embodiment illustrated, the base 74 of the dissipator body 70 is rectangular, having two opposite sides in the first direction and another two opposite sides in the second direction, to correspond to the regular rectangular or square shape of the CPU 30 that is generally available in the market, but it is understood that the base may assume other configurations, such as circular.

A holding frame 50 is provided to hold the dissipator body 70 and the CPU 30 on a ZIF type CPU connector 20 which is in turn fixed on a printed circuit board (not shown). Preferably, the holding frame 50 is made of resiliently deformable material, such as plastics, by means of injection molding.

The CPU connector 20 has a plurality of pin holes 22 to receive and establish electrical connection with pins 31 of the CPU 30. The connector 20, which is generally rectangular in shape as is generally available in the market, has two sideways lugs 21 on two opposite side walls thereof. Since the ZIF connector is known, further detail is not needed herein.

The holding frame 50 comprises a plate member 52, which in the embodiment illustrated is rectangular in shape corresponding to the dissipator body 70, preferably having a substantially flat underside to be placed on the top side of the fins 71 of the dissipator body 70. The plate member 52 has a central hole 520 (see FIG. 3) and a raised circumferential wall 58 is provided on the plate member 52 to surround the central hole 520 and define therein a fan chamber 57 (also see FIG. 3) for receiving therein a fan 51. The fan 51 is rotatably supported within the fan chamber 57 which is in communication with the air passages defined between the fins 71 through the central opening 520 when the holding frame 50 is placed on the top side of the fins 71 and is driven to rotate and generate air flows through the air passages defined by the fins 71, thus performing force convection. The fan chamber 57 is also provided with an external opening 580 on the top side of the wall 58 to allow air to flow through the fan chamber 57.

The holding frame 50 is provided with manually-operable securing means which comprises two securing arms, in the form of elongated members 53, respective formed on two opposite sides of the plate member 52 and defining an included angle with the plate 52 member, preferably 90 degrees, namely the elongated members 53 being perpendicular to the plate member 52. Since the holding frame 50 is made of resiliently deformable material, the members 53 are resiliently deformable and thus are bendable relative to the plate member 52 to change the included angle therebetween.

Each of the elongated members 53 is provided with a bore 532 having a substantially rectangular cross-section to receive therein a retaining plate 60, preferably made of a rigid material, such as metal. The retaining plate 60 comprises an elongated body longer than the elongated member 53 and is received within the bore 532 with a lower end thereof extending out of the bore 532. A hole or opening 63 is provided on the lower end of the retaining plate 60 to receive therein the corresponding sideways lug 21 of the connector 20.

Figure 3:
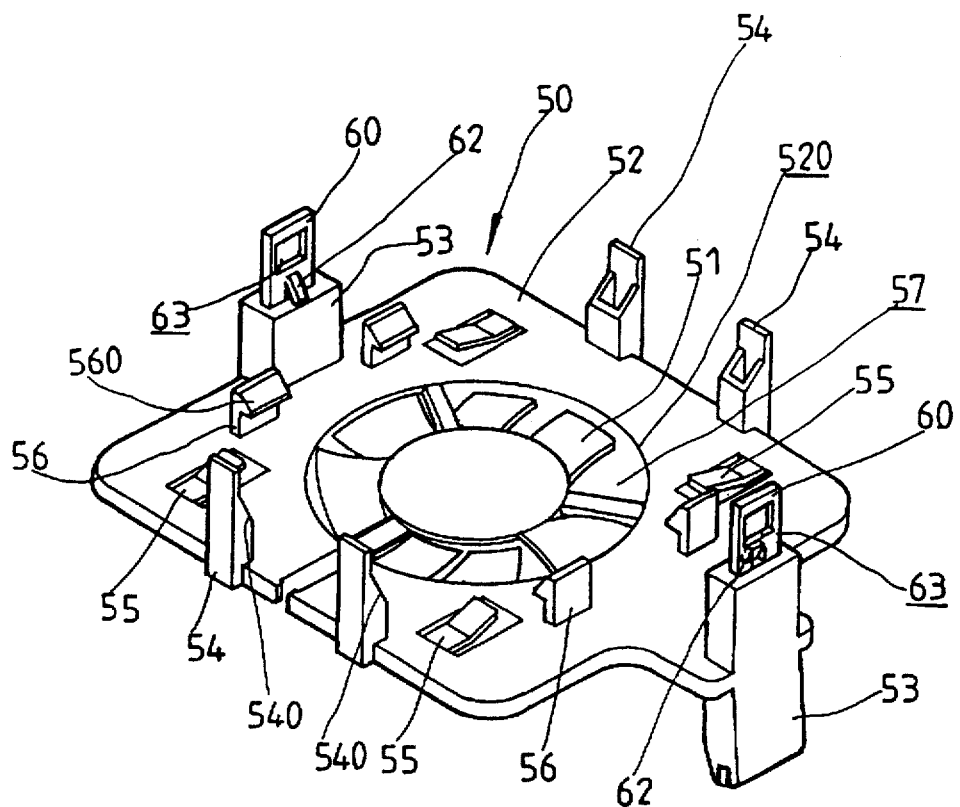
FIG. 3 is a perspective view showing the holding frame adapted in the heat dissipator of the present invention in an up-side-down condition.
Figure 4:
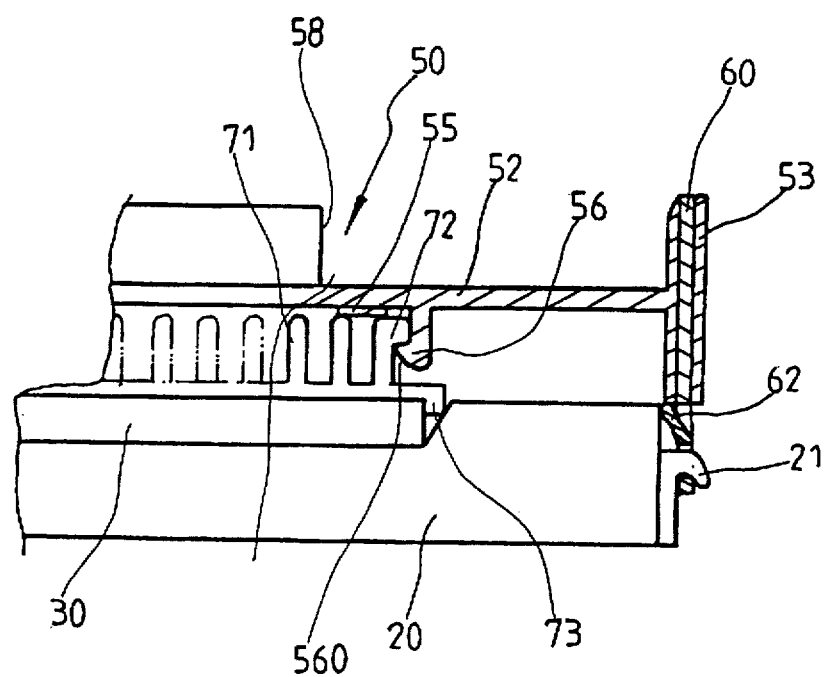
FIG. 4 is a cross-sectional view showing a portion of the heat dissipator mounted on the CPU connector with the CPU located therebetween.

The retaining plate 60 is provided with fixation means for fixing the retaining plate 60 to the respective securing arm 53, which comprises two side projections 61 provided on upper end thereof to be received and held in a slot 531 that is formed on the upper end of the elongated member 53 and transverse to the bore 532 so as to hold the retaining plate 60 in position and an inverted barb 62 which is so located on the retaining plate 60 that when the retaining plate 60 is completely received within the bore 532 of the elongated member 53, the barb 62 is located outside the bore 532 and engages against the lower end of the elongated member 53, see FIGS. 3 and 4. With the barb 62 in cooperation with the side projections 61, the retaining plate 60 is secured within the bore 532 of the elongated member 53.

The barb 62 is made elastically deformable so that when the retaining plate 60 is inserted into the bore 532 of the respective elongated member 53, the barb 62 is forced to "close" to allow the retaining plate 60 to move through the bore 532 and once the barb 62 reaches outside the bore 532, it springs back to its original position to engage against the lower end of the elongated member 53.

In mounting the dissipator body 70 to the CPU 40, the dissipator body 70 is first placed on the top side of the CPU which is mounted to the connector 20 in advance. The holding frame 50 is then placed on the top side of the fins 71 with the elongated members 53 facing the sideways lugs 21 of the connector 20. The elongated members 53 are then bent to have the holes 63 of the retaining plate 60 fit onto the sideways lugs 21 of the connector 20. Preferably, the sideways lugs 21 are each provided with an inclined edge 23 facing the lower end of the respective retaining plate 60 for providing camming action between the lower end of the retaining plate 60 and the sideways lug 21 during the mounting process. This allows the hole 63 formed on the lower end of the retaining plate 60 to slide over the inclined edge of the sideways lug 21 and fit onto the sideways lug 21 by simply forcing the holding frame 50 toward the connector 20. No manual bending is needed in this case.

Biasing means, such as leaf springs 55, are provided between the plate member 52 of the holding frame 50 and the top side of the fins 71 of the dissipator body 70 to bias the dissipator body 70 firmly against the CPU 30 and also make the retaining plate 60 securely engage the sideways lugs 21 of the connector 20. In the embodiment illustrated, the plate member 52 has four leaf springs 55 respectively located at four corners of the rectangular plate member 52, each having one end fixed to the plate member 52 of the holding frame 50 and a second, opposite end in contact engagement with the fins 71.

On the two sides of the rectangular plate member 52 other than the two sides on which the elongated members 53 are provided, the plate member 52 has a plurality of positioning tabs 54 provided thereon. In the embodiment illustrated, each of the two sides has two such positioning tabs 54 formed thereon and extending toward the connector 20 so as to sandwich the fins 71 between the positioning tabs 54 of the two sides of the plate member 52. The inside distance between the positioning tabs 54 of the two sides is substantially corresponding to the width of the dissipator body 70, namely the dimension of the dissipator body 70 measured in the direction between the two sides of the plate member 52 of the holding frame 50, for properly positioning the holding frame 50 over the dissipator body 70.

Preferably, the positioning tabs 54 are provided with downward diverging inclinations 540 to enhance the positioning of the holding frame 50 on the dissipator body 70.

The holding frame 50 is also provided with second positioning/securing means. Referring to FIGS. 2-4, the second positioning/securing means comprises a plurality of catches 56 provided on the underside of the plate member 52. The dissipator body 70 is provided with sideways-extending flanges 72 corresponding to the catches 56 to be caught thereby for positioning and securing the holding frame 52 on the top of the fins 71. In the embodiment, the fins 71 are in the form of long strips with the two outermost strips being provided with the sideways-extending flanges 72. The catches 56 are correspondingly arranged on two sides of the plate member 52 and grouped into two sets to respectively engage the two flanges 72.

The catches 56 are provided with inclinations and are elastically deformable to allow the catches 56 to undergo deformation during fitting into engagement with the flanges 72. The inclinations provide camming action to enhance the engagement of the catches 56 with the flanges 72.

The dissipator body 70 may also comprise depending flanges 73 extending downward from two opposite sides of the base 74 thereof for precisely positioning the dissipator body 70 onto the top face of the CPU 30.

Figure 5:
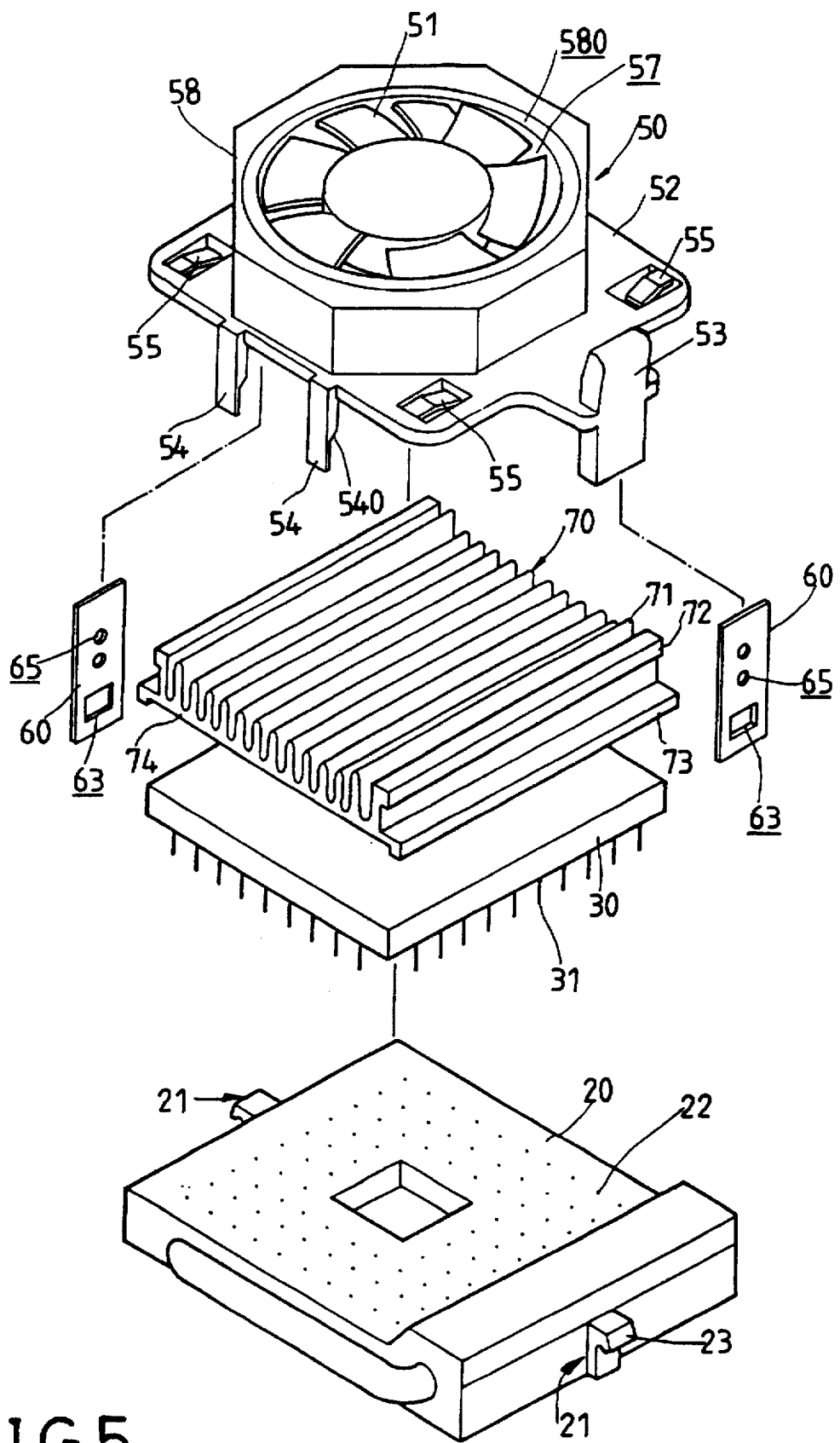
FIG. 5 is an exploded perspective view, similar to FIG. 2, but showing a second embodiment in accordance with the present invention.

In FIG. 5, a second embodiment of the present invention is shown, which is in general similar to the first embodiment illustrated in FIGS. 1-4 but having retaining plate fixation means different from that of the first embodiment. In the second embodiment, the fixation means comprises a plurality of through holes 65 formed on each of the retaining plates 60 to allow the plastic material to flow therethrough and fill therein so that when the injection molding of the holding frame 50 is completed, the retaining plates 60 are securely fixed on the securing arms 53 of the holding frame 70. In this case, the barb 62 and side projections 61 of the retaining plate 60 are no longer needed and thus eliminated. This may simplify the manufacturing of the holding frame 70.

Those skilled in the art will readily recognize that various modifications of the present invention may be made without departing the scope of the present invention defined in the appended claim. Accordingly the preferred embodiments illustrated and discussed herein should be understood to be exemplary only in nature and the scope of the instant invention should be limited only by the following claims.

What is claimed is:

1. A computer central processing unit (CPU) heat dissipator adapted to be used with a CPU connector which has two opposite sideways lugs, the heat dessipator comprising:

a heat conductive body comprising a base having a bottom face adapted to be placed on a top face of the CPU which is mounted on the connector to sandwich the CPU between the heat conductive body and the connector, the base further having an opposite top face on which a plurality of fins are formed and spaced from each other to define therebetween air passages; and a holding frame made of a resilient and deformable material, comprising a plate member having an underside to be placed on top ends of the fins to sandwich the heat conductive body between the holding frame and the CPU and a central opening around which a circumferential wall is formed on an upper surface of the plate member to define therein a fan chamber for receiving and rotatably supporting therein a convection fan, the plate member further comprising two securing arms substantially normal thereto and rotatable relative thereto, each of the securing arms having a rigid retaining plate fixed thereon, the retaining plate having an opening for receiving and fitting onto the respective sideways lug of the connector so as to secure the holding frame and the heat conductive body to the CPU and the connector.

2. The CPU heat dissipator as claimed in claim 1, wherein holding frame further comprises biasing means interposed between the underside thereof and the top ends of the fins of the heat conductive body to bias the heat conductive body firmly against the top face of the CPU.

3. The CPU heat dissipator as claimed in claim 2, wherein the biasing means comprises leaf springs having one end fixed to the holding frame and an opposite end in contact engagement with the fins.

4. The CPU heat dissipator as claimed in claim 1, wherein the holding frame further comprises positioning tabs extending from the underside of the plate member to confine the heat conductive body therebetween.

5. The CPU heat dissipator as claimed in claim 4, wherein the positioning tabs comprise downward diverging inclinations for enhancing positioning of the holding frame onto the heat conductive body.

6. The CPU heat dissipator as claimed in claim 1, wherein the holding frame further comprises a plurality of catches formed on the underside thereof and wherein the heat conductive body comprises sideways-extending flanges formed on the fins to be engaged by the catches of the holding frame.

7. The CPU heat dissipator as claimed in claim 6, wherein the catches comprise inclined faces to provide camming action with the flanges of the heat conductive body which deforms the catches to enhance the engagement therebetween.

8. The CPU heat dissipator as claimed in claim 1, wherein means for fixing the retaining plates to the respective securing arms comprises a bore formed on each of the securing arms to receive therein the respective retaining plate, the retaining plate comprising two sideways-extending projections to be received and supported within a transverse slot formed on top end of the securing arm and an elastically deformable barb engaging against lower end of the securing arm.

9. The CPU heat dissipator as claimed in claim 1, wherein the holding frame is made of a plastic material by means of injection molding and means for fixing the retaining plates to the respective securing arms comprises a plurality of through holes formed on each of the retaining plates which allow the plastic material of the respective securing arm to fill therein so as to fix the retaining plate to the securing arm.

* * * * *